(12) United States Patent
Malandain et al.

(10) Patent No.: US 11,545,793 B2
(45) Date of Patent: Jan. 3, 2023

(54) PRINTED CIRCUIT BOARD AND METHOD FOR MEASURING THE TEMPERATURE IN A POWER ELECTRICAL CONNECTOR

(71) Applicant: APTIV TECHNOLOGIES LIMITED, St. Michael (BB)

(72) Inventors: Olivier Malandain, Ormes (FR); Stéphane Barlerin, Fatines (FR)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 294 days.

(21) Appl. No.: 16/912,773

(22) Filed: Jun. 26, 2020

(65) Prior Publication Data

US 2020/0412069 A1    Dec. 31, 2020

(30) Foreign Application Priority Data

Jun. 28, 2019  (FR) ...................................... 1907203

(51) Int. Cl.
*H01R 13/66* (2006.01)
*G01K 13/00* (2021.01)
(Continued)

(52) U.S. Cl.
CPC .......... *H01R 13/665* (2013.01); *G01K 13/00* (2013.01); *H05K 1/0201* (2013.01);
(Continued)

(58) Field of Classification Search
CPC .. H05K 1/0201; H05K 1/0204; H05K 1/0206; H05K 1/0207; H05K 1/0209; H05K 1/0277; H05K 1/0283; H05K 1/0298; H05K 1/111; H05K 1/112; H05K 1/115; H05K 1/117; H05K 1/182; H05K 2201/10151;
(Continued)

(56) References Cited

U.S. PATENT DOCUMENTS 6,210,036 B1 *  4/2001  Eberle ................ H01R 13/6683
                                              337/2
11,069,992 B2 *  7/2021  Feldner ................... B60L 53/62
(Continued)

FOREIGN PATENT DOCUMENTS

DE    10 2016 211 876 A1    1/2018
WO    WO-02087296 A1  * 10/2002    ........... H05K 1/0201
WO    2018197247 A1    11/2018

OTHER PUBLICATIONS

WO 02087296 A1 (Translation) (Year: 2022).*
French Search Report for Application No. FR1907203 dated Mar. 20, 2020.

*Primary Examiner* — Hoa C Nguyen
*Assistant Examiner* — John B Freal
(74) *Attorney, Agent, or Firm* — Carlson, Gaskey & Olds, P.C.

(57) ABSTRACT

A printed circuit board is housed in a connector. A temperature sensor is mounted on the printed circuit board between two connection pads located on one of the faces of the printed circuit board. A contact housed in the connector is placed in thermal continuity with two thermal conduction lands, one of which is arranged on the same face of the printed circuit board as the connection pads and the other of which is arranged beneath the temperature sensor. Each of the connection pads is connected to a temperature measurement circuit.

11 Claims, 4 Drawing Sheets

(51) Int. Cl.
    *H05K 1/02*         (2006.01)
    *H05K 1/11*         (2006.01)
    *H05K 1/18*         (2006.01)
    *B60L 53/16*       (2019.01)

(52) U.S. Cl.
    CPC ......... *H05K 1/0206* (2013.01); *H05K 1/0207* (2013.01); *H05K 1/111* (2013.01); *H05K 1/115* (2013.01); *H05K 1/182* (2013.01); *B60L 53/16* (2019.02); *H01R 2201/26* (2013.01); *H05K 2201/10151* (2013.01)

(58) Field of Classification Search
    CPC ................ H05K 3/4691; H01R 13/665; H01R 2201/26; H01R 24/76; H01R 13/6683; G01K 13/00; G01K 1/14; G01K 1/16; B60L 53/16; Y02T 10/70; Y02T 10/7072; Y02T 90/14
    See application file for complete search history.

(56) References Cited

U.S. PATENT DOCUMENTS

| | | | |
|---|---|---|---|
| 2017/0069945 A1 | 3/2017 | Baba et al. | |
| 2017/0237205 A1* | 8/2017 | Fuehrer | H01R 13/6683 439/620.22 |
| 2018/0097316 A1* | 4/2018 | Rose | H01R 12/58 |
| 2019/0260146 A1 | 8/2019 | Feldner et al. | |

\* cited by examiner

PRINTED CIRCUIT BOARD AND METHOD FOR MEASURING THE TEMPERATURE IN A POWER ELECTRICAL CONNECTOR

CROSS REFERENCE TO RELATED APPLICATION

This application claims priority to French Patent Application No. FR1907203, filed on Jun. 28, 2019.

TECHNICAL FIELD

This disclosure relates to the field of connectors for motor vehicles. Notably, but not exclusively, the subject matter of this document relates to the field of connectors for recharging with electricity electric or rechargeable ("plug-in") hybrid motor vehicles.

BACKGROUND

In motor vehicles and notably electric or rechargeable hybrid motor vehicles, the batteries of the vehicle are recharged using a cable. Thus, as shown schematically in FIG. 1, electric or rechargeable hybrid motor vehicles 100 may comprise a connector socket 200 to which a charging plug 300, supplied with electricity by an electric vehicle supply equipment 400 via an electrical cable 500, may be connected. This charging plug 300 then allows one or more batteries mounted in the vehicle 100 to be charged.

The invention notably relates to connectors such as the connector socket 200, or male power connectors. However, the invention may potentially also be used for charging plugs 300, or female power connectors.

A power connector, whether male or female, includes a housing and power electrical contacts connected electrically to electrical wires, or conductive metal bars (busbars) forming a power electrical circuit. In this document, "contact" refers both to a male contact or electrical terminal (pin or plug) and to a female contact or electrical terminal (clip).

In some power electrical circuits, direct currents of 125 amperes, 200 amperes or even 500 amperes may be used. This creates a risk of the contacts heating up, for example, at the site of regions of contact with another contact and/or at the site of regions where the contact is crimped onto a cable. It is therefore desirable to be able to measure and monitor the temperature of the power contacts so as to decrease the amperage of the electric current flowing through them, or even to stop it by breaking the circuit, if the heating of the contact becomes too high.

One difficulty lies in accurately and reliably measuring the temperature of a contact while keeping same well isolated from any other electrical circuit.

SUMMARY

A printed circuit board for a power connector includes a dielectric support in the form of a plate with two main faces and an edge face between the two main faces. At least first and second metal layers are rigidly connected to the dielectric support and run parallel to the main faces. Additionally, a thermal conduction land is formed in each of the first and second metal layers. The respective thermal conduction lands of the first and second metal layers are electrically connected to one another at the site of a region of the edge face of the dielectric support. This region forms an area of thermal (and generally also electrical) contact with the outer peripheral surface of a power contact housed in the connector. Additionally, the printed circuit board includes a temperature sensor mounted on one of its main faces, this face being partially covered by the first metal layer and this sensor facing, through a thickness of the printed circuit board, the thermal conduction land formed in the second metal layer.

Thus, by virtue of these arrangements, there is a sensor to which heat may be conveyed along at least two thermal conduction paths, one of these paths going over the surface of the printed circuit board on which the sensor is mounted, and the other of these paths reaching the sensor from below. This arrangement makes it possible to significantly improve the accuracy of measurement of the temperature of a contact by minimizing the difference between its temperature and the temperature of the printed circuit board at the site of the sensor. Other arrangements presented below may allow this accuracy to be increased further.

This printed circuit board optionally includes at least one of the following features, each considered independently of one another, or in combination with one or more others:
- the thermal conduction land of the first metal layer includes an indent and the sensor is mounted in this indent;
- the indent in the thermal conduction land of the first metal layer has two edges, each located respectively on either side of the indent, and the sensor is mounted between two connection pads, each located respectively facing one of these edges;
- the sensor is connected to at least one connection pad located on one of the main faces of the printed circuit board, this pad being connected in turn, through a thickness of the dielectric support, to a connection land formed in the second metal layer, this connection land being electrically isolated from the thermal conduction lands of the first and second metal layers and being at least partially covered by the thermal conduction land of the first metal layer; the second metal layer is arranged in the thickness of the dielectric support; the printed circuit board further comprises a third metal layer arranged on the other main face of the dielectric support in relation to the first metal layer, a thermal conduction land being formed in this third metal layer and being electrically connected to the thermal conduction lands formed respectively in the first and second metal layers;
- the printed circuit board further comprises a fourth metal layer arranged in the thickness of the dielectric support, a thermal conduction land being formed in this fourth metal layer and being electrically connected at least to the thermal conduction lands formed respectively in the first and second metal layers; it comprises two measurement portions that are electrically isolated from one another, each one including a region on the edge face of the dielectric support at the site of which thermal conduction lands formed in the first and second metal layers are connected; and
- it includes, between the two measurement portions, a flexible portion suitable for accommodating a movement of one of the measurement portions relative to the other, parallel to the plane of the main faces of the dielectric support.

According to another aspect, a power connector includes at least one power contact with an outer peripheral surface and at least one printed circuit board such as presented above, the outer peripheral surface of the contact making contact with a region on the edge face of the dielectric support at the site of which thermal conduction lands formed in the first and second metal layers are connected.

According to another aspect, a method for measuring the temperature of a contact housed in a power connector includes a printed circuit board placed in the connector. A temperature sensor is mounted on the circuit board between two connection pads located on a face of the printed circuit board. Each of the connection pads is connected to a temperature measurement circuit. The contact is placed in thermal continuity with two thermal conduction lands, one of which is arranged on the same face of the printed circuit board as the connection pads and the other of which is arranged beneath the temperature sensor.

BRIEF DESCRIPTION OF THE DRAWINGS

Further features, aims and advantages of a disclosed example embodiment of the invention will become apparent from reading the following detailed description with reference to the appended drawings, which are given by way of non-limiting examples and in which.

DETAILED DESCRIPTION

In the figures, the same references denote identical or similar elements.

Figure 1:
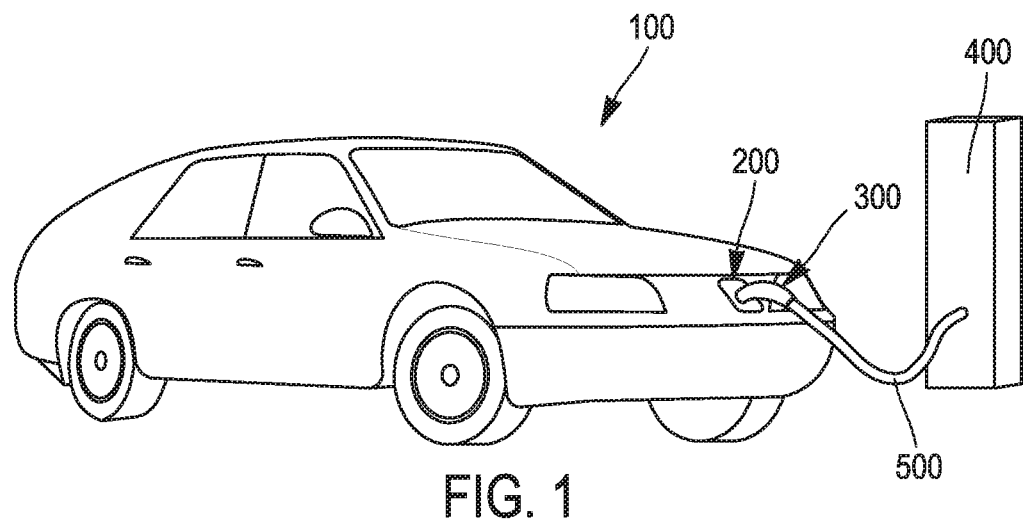
FIG. 1 schematically shows an electric or rechargeable hybrid vehicle supplied with power using a charging plug.
Figure 2:
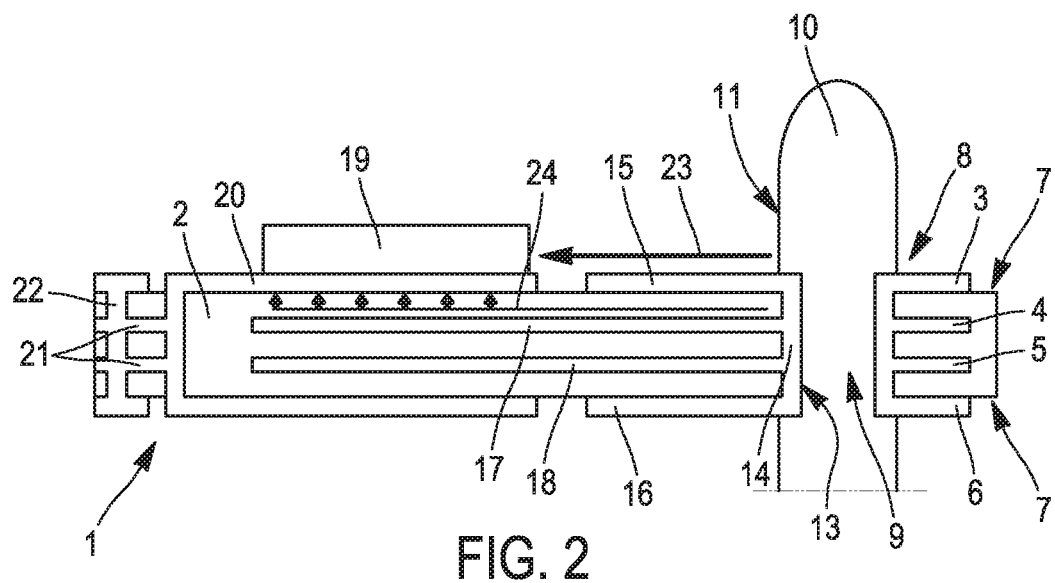
FIG. 2 schematically shows, in cross section, one embodiment example of a printed circuit board.

A first embodiment example of a printed circuit board is described below with reference to FIG. 2.

According to this example, the printed circuit board 1 is a multilayer circuit board with a dielectric support 2 or substrate and four conductive metal layers 3, 4, 5, 6 separated by insulating material of the dielectric support 2. The dielectric support 2 is for example composed, in a known manner, of an epoxy resin which may or may not be reinforced with glass fibres. The conductive metal layers 3, 4, 5, 6 are for example composed of sheets of copper or of a copper alloy. The conductive metal layers 3, 4, 5, 6 have for example a thickness of 35 micrometres, with 250-micrometre layers of dielectric material intercalated between them. The printed circuit board 1 includes two outer conductive metal layers 3, 6 and two inner conductive metal layers 4, 5. The outer conductive metal layers 3, 6 run parallel to the main faces 7 of the dielectric support 2 on which they rest. The inner conductive metal layers 4, 5 run parallel to the main faces 7 of the dielectric support 2 into which they are inserted.

A recess 8 is formed through the entire thickness of the printed circuit board 1, through all of the conductive metal layers 3, 4, 5, 6 and dielectric material. This recess 8 is suitable for insertion into a groove 9 formed in the outer peripheral surface 11 of a contact 10. The recess 8 takes the shape of a "U" with a semicircular bottom and two mutually parallel guide edges 12, corresponding to the arms of the U (see also FIGS. 6 to 7). This recess 8 includes an edge face 13. This edge face 13 is at least partially covered by a layer of a conductive material 14, for example by 20 micrometres of copper deposited by means of a chemical and electrolytic process. The layer of conductive material deposited on the edge face 13 extends all the way around the portion of the recess 8 which is intended to come into contact with the contact, via outer thermal conduction lands 15, 16 formed respectively in the outer conductive metal layers 3, 5. Thus, the outer thermal conduction lands 15, 16 are in electrical and thermal continuity with the edge face 13. Similarly, inner thermal conduction lands 17, 18, formed respectively in the inner conductive metal layers 4, 5, are in electrical and thermal continuity with the edge face 13. Thus, the outer and inner thermal conduction lands 15, 16 and 17, 18 are in electrical and thermal continuity with a contact 10 housed in the recess 8. The inner thermal conduction lands 17, 18 extend at least partially beneath a temperature sensor 19 deposited on one of the main faces 7 of the dielectric support 2. The outer thermal conduction lands 15, 16 extend until they are in proximity to the connection pads 20 to which the sensor 19 is connected. For example, a distance of about 2 millimetres separates the outer thermal conduction lands 15, 16 from the connection pads 20.

Connection lands 21 are also formed in the inner metal layers 4, 5. These connection lands 21 are suitable for forming an electrical connection between the connection pads 20 to which the sensor 19 is connected and an electrical measurement circuit (not shown). The connection pads 20 formed in the outer conductive layers 3, 6 are electrically connected to the connection lands 21 formed in the inner conductive layers 4, 5 by means of vias 22.

The sensor 19 is therefore connected between two connection pads 20 located on one of the main faces 7 of the printed circuit board 1. These connection pads 20 are connected, through thicknesses of the dielectric support 2, to the connection lands 21 formed in the inner conductive metal layers 4, 5. These connection lands 21 are electrically isolated from the thermal conduction lands of the outer conductive metal layers 3, 6 and are at least partially covered by the outer thermal conduction lands 15, 16.

Thus, the heat generated at the site of the contact 10 may be transmitted to the sensor 19 along at least two favoured conduction path types: a first thermal conduction path 23 at the level of the outer thermal conduction lands 15, 16 and a second first thermal conduction path 24 at the level of the inner thermal conduction lands 17, 18.

Figure 3:
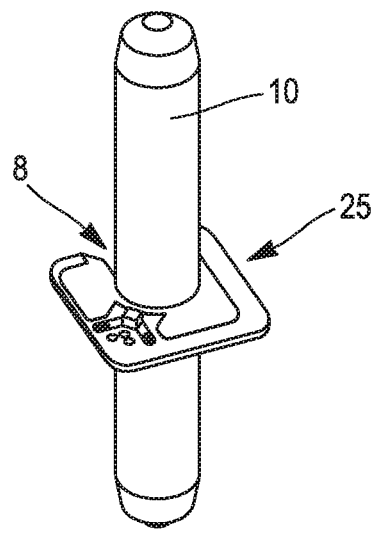
FIG. 3 schematically shows, in perspective, one embodiment example of a printed circuit board.
Figure 4:
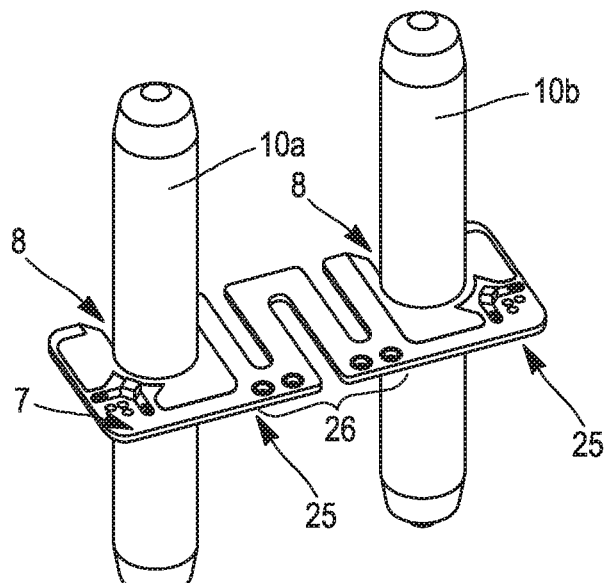
FIG. 4 schematically shows, in perspective, another embodiment example of a printed circuit board.

A circuit such as described above may be used to measure the temperature of a single contact 10 (see FIG. 3) or of a plurality of contacts 10a, 10b (for example two contacts 10a, 10b as shown in FIG. 4).

When a printed circuit board 1 such as described above is used to measure the temperature of a plurality of contacts 10a, 10b, it is advantageous to mount thereon at least one sensor 19 per contact. In other words, in this case the printed circuit board 1 comprises at least two measurement portions 25, electrically isolated from one another. Each of these measurement portions 25 includes a region on the edge face 13 of the dielectric support 2 at the site of which thermal conduction lands 15, 16, 17, 18, formed in the inner and outer conductive metal layers 4, 5 and 3, 6, are connected. Each region is suitable for being brought into contact with a contact 10.

Additionally, this printed circuit board 1 may then comprise, between two measurement portions 25, a flexible portion 26 suitable for accommodating a movement of one of the measurement portions 25 relative to the other, parallel to the plane of the main faces 7 of the dielectric support 2. This flexible portion 26 is for example formed by means of a meander, or an "S" shape, or a "U" shape with each of the arms of the "U" in common with another "U", upside-down and connected to one of the measurement portions 25.

Figure 5:
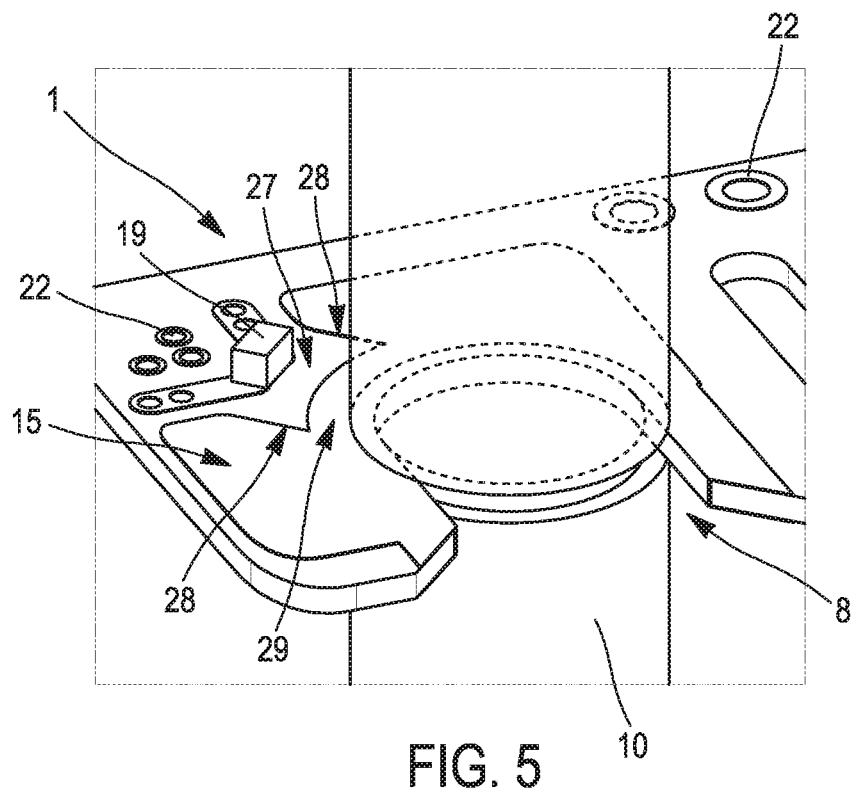
FIG. 5 schematically shows, in perspective, a portion of the printed circuit board shown in FIG. 3.
Figure 6:
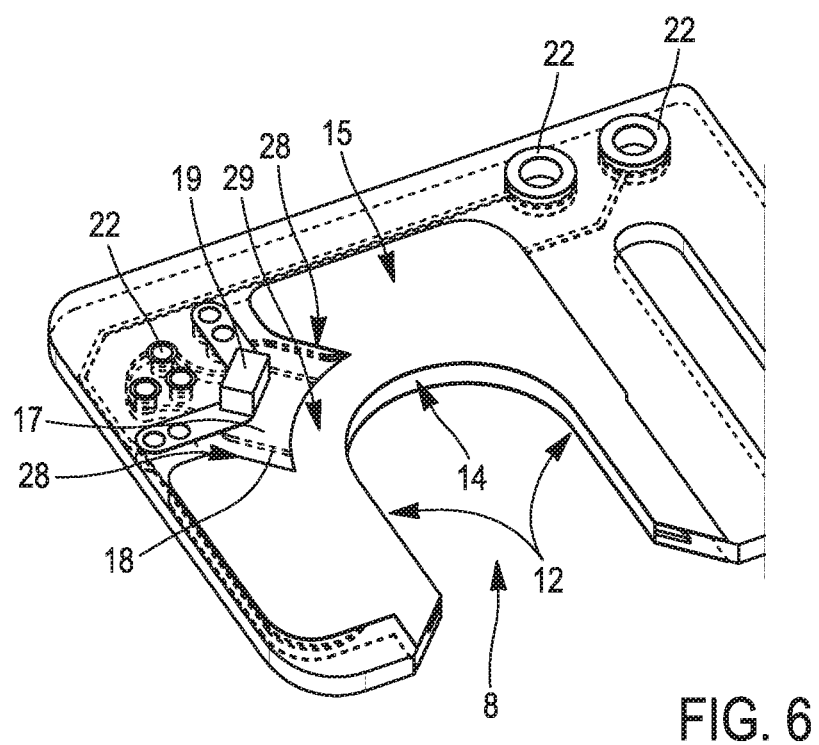
FIG. 6 schematically shows, in perspective and partially transparently, the portion of the printed circuit board shown in FIG. 5.
Figure 7:
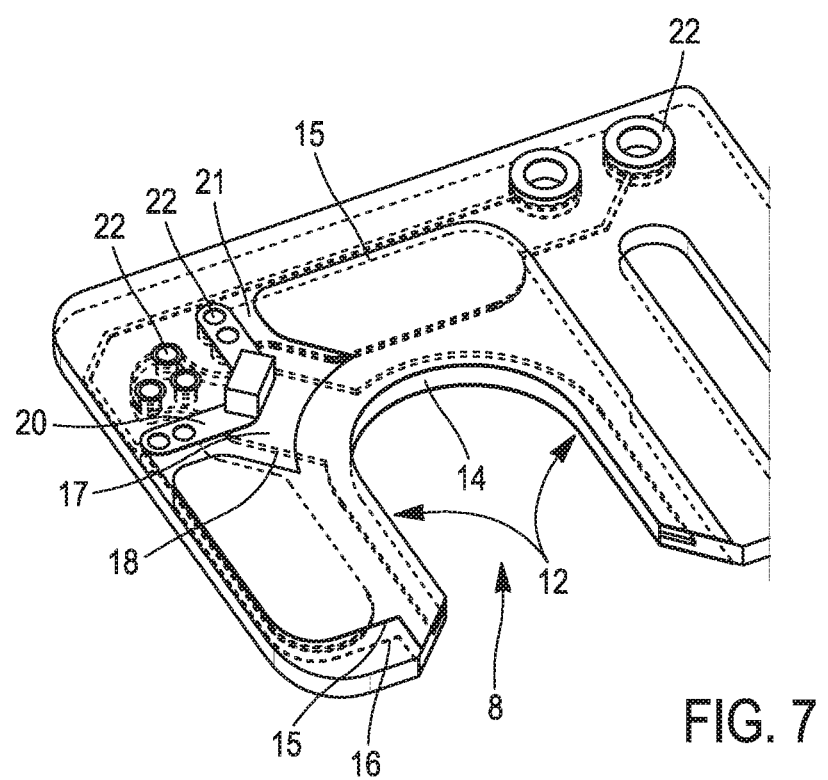
FIG. 7 schematically shows, in perspective and partially transparently, the portion of the printed circuit board shown in FIGS. 5 and 6.

FIGS. 5 to 7 show, in greater detail, an example of shapes which may be given to the different connection lands 21 and thermal conduction lands 15, 16, 17, 18.

For example, the outer thermal conduction lands 15, 16 are inscribed in a square or rectangular shape. One of the sides of this shape is open to the recess 8. Additionally, one of the corners of this shape includes an indent 27. This indent 27 includes two edges 28 that are substantially parallel to one another and each located respectively on either side of the indent 27. The two connection pads 20 are each located respectively facing one of these edges 28. The bottom 29 of the indent 27 is formed of a conductive metal strip in the shape of a circular arc extending for example over a width of 3 millimetres from the recess 8. The sensor 19 is placed facing this conductive metal strip at a distance of 2 millimetres for example.

The two connection pads 20 of elongate shape extend from the outside to the inside of the indent 27. These connection pads 20 each have one end connected to the sensor 19 and another end connected to inner connection lands 21, and to the other outer metal layer 6, by means of two vias 22. The inner connection lands 21 are largely located beneath/between regions of the outer thermal conduction lands 15, 16, and run parallel to two of the edges of the square or rectangle shape of the outer thermal conduction lands 15, 16 up to conductive vias 22 which go to the main faces of the dielectric support 2 in order to electrically connect them to a measurement circuit.

The inner thermal conduction lands 17, 18 run mainly in the form of a strip, beneath the indent 27, between the recess 8 and three conductive vias 22 located on the other side of the contact 10 in relation to the recess 8. Thus, this strip runs beneath the sensor 19. The three vias 22 connect the two inner thermal conduction lands 17, 18 together.

The preceding description is exemplary rather than limiting in nature. Variations and modifications to the disclosed examples may become apparent to those skilled in the art that do not necessary depart from the essence of this invention. The scope of legal protection given to this invention can only be determined by studying the following claims.

We claim:

1. A printed circuit board for a power connector, the printed circuit board comprising:
    a dielectric support in the form of a plate with two main faces and an edge face between the two main faces;
    at least one connection pad on at least one of the main faces;
    a first metal layer rigidly connected to the dielectric support and running parallel to the main faces;
    a second metal layer rigidly connected to the dielectric support and running parallel to the main faces, the second metal layer being arranged in the thickness of the dielectric support, the second metal layer including a connection land electrically connecting the at least one connection pad to a measurement electrical circuit, wherein the at least one connection pad is connected through a thickness of the dielectric support to the connection land;
    each of the first and second metal layers including a thermal conduction land, the thermal conduction lands being electrically connected to one another near a region of the edge face of the dielectric support, wherein the connection land is electrically isolated from the thermal conduction lands of the first and second metal layers and at least partially covered by the thermal conduction land of the first metal layer; and
    a temperature sensor mounted on one of the main faces that is partially covered by the first metal layer, the temperature sensor facing the thermal conduction land of the second metal layer through a thickness of the printed circuit board, the temperature sensor being connected to the at least one connection pad.

2. The printed circuit board according to claim 1, wherein the thermal conduction land of the first metal layer includes an indent and the temperature sensor is mounted in the indent.

3. The printed circuit board according to claim 2, wherein the indent has two edges on either side of the indent and the temperature sensor is mounted between two connection pads respectively facing one of these edges.

4. The printed circuit board according to claim 1, wherein the printed circuit board includes a third metal layer;
    the first metal layer is arranged on one of the main faces;
    the third metal layer is arranged on another one of the main faces; and
    the third metal layer includes a thermal conduction land electrically connected to the thermal conduction lands of the first and second metal layers.

5. The printed circuit board according to claim 1, wherein the printed circuit board includes a fourth metal layer arranged in the thickness of the dielectric support,
    the fourth metal layer includes a thermal conduction land electrically connected at least to the thermal conduction lands of the first and second metal layers.

6. The printed circuit board according to claim 5, wherein the printed circuit board includes a recess configured for insertion of a contact,
    the temperature sensor is on one side of the recess, and
    the thermal conduction lands of the second and fourth metal layers run beneath the temperature sensor up to at least one via located on another side of the recess.

7. The printed circuit board according to claim 1, comprising at least two measurement portions that are electrically isolated from one another, each of the at least two measurement portions including a region on the edge face of the dielectric support near where the thermal conduction lands of the first and second metal layers are connected.

8. A power connector, comprising
    at least one printed circuit board according to claim 1, and
    at least one power contact including an outer peripheral surface making contact with a region on the edge face of the dielectric support near where the thermal conduction lands of the first and second metal layers are connected.

9. A method of measuring the temperature of a contact housed in a power connector, the method comprising placing the printed circuit board of claim 1 in the power connector and connecting the at least one connection pad to the electrical measurement circuit.

10. A printed circuit board for a power connector, the printed circuit board comprising:
    a dielectric support in the form of a plate with two main faces and an edge face between the two main faces;
    at least one connection pad on at least one of the main faces;

a first metal layer rigidly connected to the dielectric support and running parallel to the main faces;

a second metal layer rigidly connected to the dielectric support and running parallel to the main faces, the second metal layer being arranged in the thickness of the dielectric support, the second metal layer including a connection land electrically connecting the at least one connection pad to a measurement electrical circuit, wherein the at least one connection pad is connected through a thickness of the dielectric support to the connection land;

each of the first and second metal layers including a thermal conduction land, the thermal conduction lands being electrically connected to one another near a region of the edge face of the dielectric support, wherein the connection land is electrically isolated from the thermal conduction lands of the first and second metal layers and at least partially covered by the thermal conduction land of the first metal layer;

a temperature sensor mounted on one of the main faces that is partially covered by the first metal layer, the temperature sensor facing the thermal conduction land of the second metal layer through a thickness of the printed circuit board, the temperature sensor being connected to the at least one connection pad; and wherein the connection land extends up to at least one conductive via that goes to the main faces of the dielectric support.

11. A printed circuit board for a power connector, the printed circuit board comprising:

a dielectric support in the form of a plate with two main faces and an edge face between the two main faces;

at least one connection pad on at least one of the main faces;

a first metal layer rigidly connected to the dielectric support and running parallel to the main faces;

a second metal layer rigidly connected to the dielectric support and running parallel to the main faces, the second metal layer being arranged in the thickness of the dielectric support, the second metal layer including a connection land electrically connecting the at least one connection pad to a measurement electrical circuit, wherein the at least one connection pad is connected through a thickness of the dielectric support to the connection land;

each of the first and second metal layers including a thermal conduction land, the thermal conduction lands being electrically connected to one another near a region of the edge face of the dielectric support, wherein the connection land is electrically isolated from the thermal conduction lands of the first and second metal layers and at least partially covered by the thermal conduction land of the first metal layer;

a temperature sensor mounted on one of the main faces that is partially covered by the first metal layer, the temperature sensor facing the thermal conduction land of the second metal layer through a thickness of the printed circuit board, the temperature sensor being connected to the at least one connection pad;

at least two measurement portions that are electrically isolated from one another, each of the at least two measurement portions including a region on the edge face of the dielectric support near where the thermal conduction lands of the first and second metal layers are connected; and a flexible portion between the two measurement portions, the flexible portion being configured to accommodate movement of one of the at least two measurement portions relative to the other parallel to the plane of the main faces.

* * * * *